United States Patent
Diamant et al.

(10) Patent No.: US 10,187,081 B1
(45) Date of Patent: Jan. 22, 2019

(54) DICTIONARY PRELOAD FOR DATA COMPRESSION

(71) Applicant: Amazon Technologies, Inc., Seattle, WA (US)

(72) Inventors: Ron Diamant, Albany, CA (US); Ori Weber, Tel Aviv (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/633,506

(22) Filed: Jun. 26, 2017

(51) Int. Cl.
*H03M 7/34* (2006.01)
*H03M 7/30* (2006.01)

(52) U.S. Cl.
CPC ................. *H03M 7/3088* (2013.01)

(58) Field of Classification Search
CPC . H03M 7/3088; H03M 7/3093; H03M 7/3084
USPC ............................................. 341/50, 51, 106
See application file for complete search history.

(56) References Cited

U.S. PATENT DOCUMENTS

| | | | | |
|---|---|---|---|---|
| 5,442,350 A * | 8/1995 | Iyer | ................... | G06F 17/30595 341/106 |
| 5,870,036 A * | 2/1999 | Franaszek | ........... | H03M 7/3086 341/51 |
| 5,874,908 A * | 2/1999 | Craft | ........................ | G06T 9/005 341/87 |
| 6,466,999 B1 | 10/2002 | Sliger et al. | | |
| 6,657,565 B2 * | 12/2003 | Kampf | ................ | H03M 7/3088 341/51 |
| 6,683,547 B2 * | 1/2004 | Border | ................ | H03M 7/3088 341/106 |
| 7,688,233 B2 * | 3/2010 | Schneider | ........... | H03M 7/3086 341/107 |
| 8,832,045 B2 * | 9/2014 | Dodd | ................... | G06F 11/1451 707/693 |
| 9,727,574 B2 * | 8/2017 | Francis | ............. | G06F 17/30153 |
| 2002/0057213 A1 * | 5/2002 | Heath | ................. | H03M 7/3088 341/51 |
| 2003/0030575 A1 * | 2/2003 | Frachtenberg | ...... | H03M 7/3088 341/51 |

OTHER PUBLICATIONS

Feldspar, Antaeus. An Explanation of the Deflate Algorithm [online]. zlib, 2002 [retrieved on Jun. 26, 2017]. Retrieved from the Internet: <URL: http://www.zlib.net/feldspar.html>, 5 pages.

(Continued)

*Primary Examiner* — Peguy Jean Pierre
(74) *Attorney, Agent, or Firm* — Kilpatrick Townsend & Stockton LLP

(57) ABSTRACT

Disclosed herein are techniques for improving compression ratio for dictionary-based data compression. A method includes receiving a data block to be compressed, selecting an initial compression dictionary from a plurality of initial compression dictionaries based on a characteristic of the data block, loading the initial compression dictionary into an adaptive compression dictionary in a buffer, and compressing the data block using the adaptive compression dictionary. The method also includes updating the adaptive compression dictionary based on data in the data block that has been compressed, while compressing the data block.

20 Claims, 10 Drawing Sheets

(56) References Cited

OTHER PUBLICATIONS

History of Lossless Data Compression Algorithms. [online]. ETHW, 2014 [retrieved on Jun. 26, 2017]. Retrieved from the Internet: <URL: http://ethw.org/History_of_Lossless_Data_Compression_Algorithms#LZ77>, 15 pages.

Kärkkäinen, Juha. LZ77 [online] University of Helsinki, 2012 [retrieved on Jun. 26, 2017]. Retrieved from the Internet: >URL: https://www.cs.helsinki.fi/u/tpkarkka/opetus/12k/dct/lecture07.pdf>, 10 pages.

LZ77 and LZ78. [online]. Wikipedia, Mar. 2017 [retrieved on Jun. 26, 2017]. Retrieved from the Internet: <URL: https://en.wikipedia.org/wiki/LZ77_and_LZ78>, 5 pages.

\* cited by examiner

Dictionary

| Index | String |
|---|---|
| 1 | = a |
| 2 | = ab |
| 3 | = aa |
| 4 | = c |
| 5 | = abc |
| 6 | = abcb |

Input / Output

Step 1 (0, a) — a
Step 2 (1, b) — a b
Step 3 (1, a) — a b a
Step 4 (0, c) — a b a c
Step 5 (2, c) — a b a c a b c
Step 6 (5, b) — a b a c a b c a b c b ■ Next character
▨ Match

FIG. 7

DICTIONARY PRELOAD FOR DATA COMPRESSION

BACKGROUND

Demand for systems with high bandwidth networking and large storage space continues to increase. Making such systems is often both expensive and technically challenging. Instead of trying to increase the bandwidth and storage space of the hardware systems, various data compression techniques may be used to reduce the total number of bytes used to represent the data, such that the currently available storage space and networking bandwidth of the hardware systems may be more efficiently utilized for better system performance.

There are generally two types of data compression techniques: lossy data compression and lossless data compression. Lossy data compression allows for some loss of fidelity in the compressed information and may achieve a high compression ratio. Lossy data compression may be suitable, for example, for applications that process audio, image, and/or video data. Lossless data compression can ensure that the decompressed data is the exact copy of the original data, and therefore is often used in many data processing applications (e.g., those with text or computer executable code) where it is desirable that the decompressed data exactly matches the original data. A lossless data compression technique that can achieve a higher compression ratio and/or a high compression speed is often desired.

BRIEF DESCRIPTION OF THE DRAWINGS

Various embodiments in accordance with the present disclosure will be described with reference to the drawings, in which:

FIG. 7 illustrates an example of data decompression using a dictionary-based compression method;

DETAILED DESCRIPTION

Figure 1:
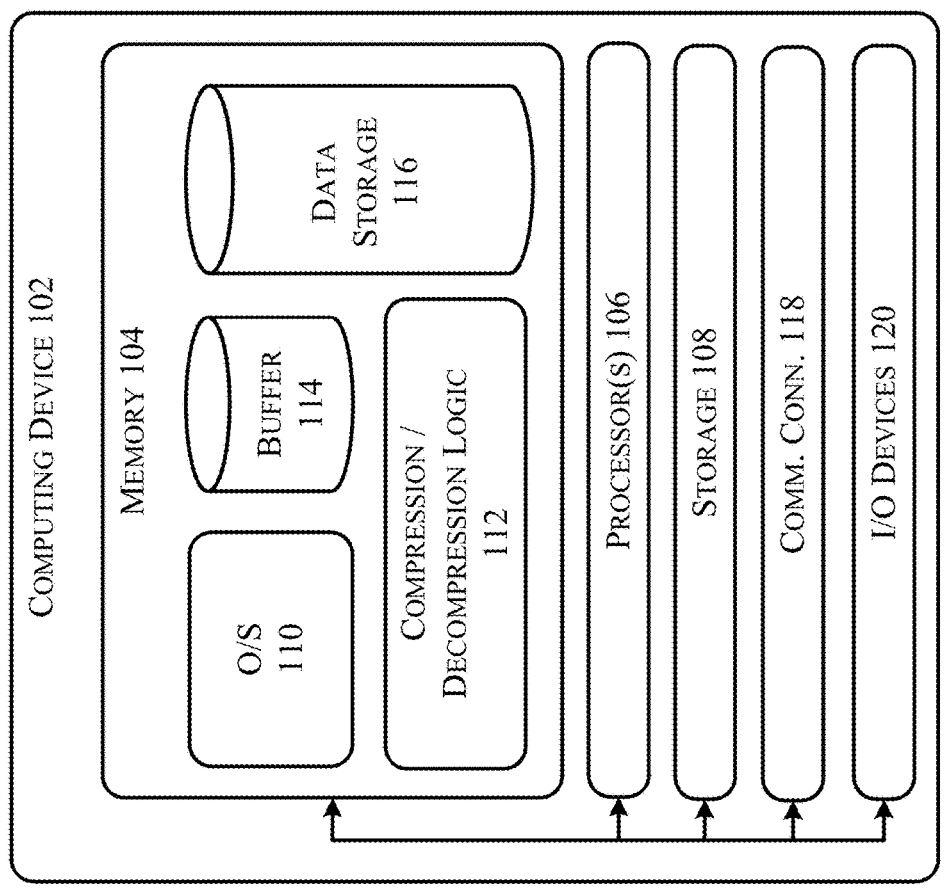
FIG. 1 depicts a computing device configured to implement some data compression techniques in accordance with the present disclosure.

As demand for hardware systems with high bandwidth networking and large storage space keeps increasing, data compression techniques are in constant demand in order to reduce the hardware system costs and improve system performance and durability. For example, compressing data before writing it to storage is an effective way to reduce the system's storage footprint, which may significantly reduce the cost for data storage. Furthermore, data compression can reduce the size of the data being transferred between devices, and thus can improve a system's overall performance, as data access speed and bandwidth are often the bottleneck of the system.

Lossy compression techniques generally reduce data size by removing small details that require a relatively large amount of data to store at full fidelity. In lossy compression, it is impossible to restore the original data due to the removal of essential information. While lossy compression may achieve very high compression ratios through data removal, it does permanently lose some information in the original data that may not be fully recovered. In contrast, lossless data compression is an invertible operation, and thus a decompression function can fully restore the original data with no loss of information.

Dictionary-based compression methods, such as Lempel-Ziv (LZ)-based compression methods, are widely used lossless compression techniques. Dictionary-based compression methods generally involve finding repeating sequences in the input data and replacing the repeating sequences with a (pointer, length) tuple that represents a <length> number of bytes of data starting from the pointer location in a dictionary (or history window).

Dictionary-based compression methods generally take a certain time to build the dictionary. When the data compression process starts, the dictionary has no entries. Thus, when compressing a symbol for the first time, there is a 0% chance that a match will be found in the dictionary. Similarly, for the following bytes of the input data, the number of entries in the dictionary is still relatively small, and thus the chance of finding a match in the dictionary is still very low. As the dictionary is being built while more data in the input data is processed, the probability of finding a matching sequence in the dictionary increases, and thus the compression ratio increases as well. After processing a significant amount of data (e.g., 32 kB or 64 kB in some standards, such as the Deflate method used in gzip, Portable Network Graphics (PNG), Hypertext Transfer Protocol (HTTP), Secure Sockets Layer (SSL), etc.), the dictionary becomes full, and the compression ratio may reach a saturation point. Because of the relatively low compression ratio before the dictionary is full, the overall compression ratio may not be as high as possible. In particular, for a small file or other data block (e.g. 4 kB or less), the dictionary may never be completely filled, and thus a compression ratio saturation point may never be reached before the data compression process completes. Therefore, the compression ratio for small files or other data blocks may be relatively low.

Described herein are techniques to reduce or eliminate the dictionary built-up time using a pre-generated dictionary that includes entries (data sequences) that are most likely to be found in the beginning of a file or other data block to be compressed. The dictionary used may be different for different types of files or applications (e.g., Solid-State Drive (SSD), HTTP, etc.). When a data compression process begins, an appropriate pre-generated dictionary may be selected and loaded to a buffer and used to compress the file or other data block. Because a high (if not maximum) compression ratio is achieved from the beginning of the data compression process, a high overall compression ratio can be achieved regardless of the size of the file or other data block.

In the description herein, various embodiments are described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 depicts a computing device 102 configured to implement some data compression techniques in accordance with the present disclosure. Computing device 102 may include any system associated with an entity that provides a computing resource or service. In some embodiments, the computing device may handle functionality of a computer application associated with the entity that provides the computing resource or service. In the present disclosure, computing device 102 may include a computing system in which some disclosed techniques may be implemented. In some implementations, computing device 102 may include one or more special-purpose hardware devices for implementing the described techniques. In some embodiments, computing device 102 may comprise an integrated circuit, such as an application-specific integrated circuit (ASIC), a field-programmable gate array (FPGA), a microcontroller, a microprocessor, a graphics processing unit (GPU), or a system on chip (SoC). In some embodiments, computing device 102 may comprise a computer-readable medium communicatively coupled with one or more processors configured to execute computer executable instructions stored on the computer-readable medium. For example, the computer-readable medium may include an embedded software capable of being executed by the one or more processors.

Computing device 102 may be any type of computing device, such as, but not limited to, a mobile phone, a smart phone, a personal digital assistant (PDA), a laptop computer, a desktop computer, a server computer, a thin-client device, a tablet PC, etc. Additionally, it should be noted that in some embodiments, computing device 102 may be implemented using one or more virtual machines implemented in a hosted computing environment, which may also be referred to as a cloud-computing environment. The hosted computing environment may include one or more rapidly provisioned and released computing resources, which may include computing, networking, and/or storage devices.

In one illustrative configuration as shown in FIG. 1, computing device 102 may include at least one memory 104 and one or more processing units or processor(s) 106. Processor(s) 106 may be implemented as appropriate in hardware, computer-executable instructions, firmware, or any combinations thereof. Processor(s) 106 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in processor(s) 106 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. Computer-executable instructions or firmware implementations of processor(s) 106 may include computer-executable or machine executable instructions written in any suitable programming language to perform the various functions described. Computing device 102 may also include additional storage 108, such as either removable storage or non-removable storage including, but not limited to, magnetic storage, optical disks, and/or tape storage. Disk drives and their associated computer-readable media may provide non-volatile storage of computer-readable instructions, data structures, program modules, and other data for the computing device.

Memory 104 may store program instructions and/or data compression dictionaries that may be loadable and/or executable on processor(s) 106, as well as data generated during the execution of these instructions. Depending on the configuration and the type of computing device 102, memory 104 may be volatile (such as random access memory (RAM)) and/or non-volatile (such as read-only memory (ROM), flash memory, etc.). In some implementations, memory 104 may include multiple different types of memory, such as static random access memory (SRAM), dynamic random access memory (DRAM), or ROM. Memory 104 may include an operating system 110 and one or more application programs or services for implementing the features disclosed herein including at least a compression/decompression logic 112. Memory 104 may also include a buffer 114 which may provide temporary storage of, for example, a portion of the input data and/or a compression dictionary, for processing the input data, and a data storage 116 that may store compressed (and uncompressible) sequences. In some embodiments, data storage 116 may be stored in a database. In some embodiments, compression/decompression logic 112 and/or processor(s) 106 may comprise a processing entity. Such a processing entity is described in greater detail below with respect to FIG. 2. Compression/decompression logic 112 and/or buffer 114 may be implemented using a software based implementation or a hardware-based implementation. In some embodiments, compression/decompression logic 112, data storage 116, and/or buffer 114 may be located outside of memory 104 (e.g., on a circuit separate from memory 104).

In some embodiments, compression/decompression logic 112 may be configured to receive a data stream and apply one or more compression or decompression techniques to the data in the data stream. In some embodiments, compression/decompression logic 112 may be implemented as a combination of hardware and software. For example, in some embodiments, compression/decompression logic 112 may comprise a circuit configured to perform the described functions. In some embodiments, compression/decompression logic 112 may comprise a software application or module installed on a memory device that, when executed, causes a communicatively coupled circuit to perform the described functions. As stated above, compression/decompression logic 112 may be configured to execute one or more compression or decompression techniques on a data stream. For example, compression/decompression logic 112 may be configured to input at least a portion of the data stream to be processed into buffer 114. When performing a compression function, compression/decompression logic 112 may be configured to identify pairs of matching data within buffer 114 and store indications of the matching data. When performing a decompression function, compression/decompression logic 112 may be configured to construct a decompressed version of the portion of the data stream using indications of matching data. These functions are described in greater detail with respect to FIGS. 2-10 below.

Buffer 114 may comprise any suitable volatile or non-volatile memory. In some embodiments, buffer 114 may comprise a RAM. For example, buffer 114 may comprise an SRAM or a DRAM. In some embodiments, buffer 114 may comprise an on-chip memory, such as scratchpad memory. It should be noted that buffer 114 may comprise zero-capacitor random access memory (Z-RAM®), TTRAM, advanced random access memory (A-RAM), ETA RAM, registers, or any other memory suited for temporary data storage. Buffer 114 may be configured to store a compression dictionary and data from a data stream while that data stream is being processed by compression/decompression logic 112. Once completed, the processed data may be written to data storage 116.

Data storage 116 may comprise any suitable volatile or non-volatile memory. In some embodiments, data storage 116 may comprise a read-only memory (ROM), a flash memory, a hard disk drive, an optical disc, or any other memory suited for long-term data storage. In some embodiments, compression/decompression logic 112 may store sequences of compressed and/or uncompressible data to data storage 116 upon completion of a compression function. In some embodiments, compression/decompression logic 112 may retrieve sequences (or other portions of data) from data storage 116 in order to perform a decompression function on the retrieved sequences.

Computing device 102 may also include communication connection(s) 118 that allow computing device 102 to communicate with a stored database, another computing device or server, user terminals, and/or other devices over a network connection. Communication connection(s) 118 may include hardware and/or software for communicating with a network. Communication connection(s) 118 may, for example, include physical connectors or physical ports for wired connection to a network, and/or antennas for wireless communication to a network. Communication connection(s) 118 may further include hardware and/or software configured to implement a network protocol stack. Communication connection(s) 118 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, communication connection(s) 118 may include multiple network interface modules, each configured to communicate with a different network. For example, in these implementations, communication connection(s) 118 may include a network interface module for communicating with a wired Ethernet network, a wireless 802.11 network, a cellular network, an Infiniband network, etc.

Computing device 102 may also include input/output (I/O) device(s) 120 and/or ports for enabling connection with, for example, a keyboard, a mouse, a pen, a voice input device, a touch input device, a display, speakers, a printer, etc. Computing device 102 may also include bus interface(s) to I/O device(s) 120 or other external entities. The bus interface(s) may include a physical interface for connecting to a cable, socket, port, or other connection to the external communication medium. The bus interface(s) may further include hardware and/or software to manage incoming and outgoing transactions. The bus interface(s) may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface(s) may include the physical layer for any of these bus protocols, including a connector, power management, and error handling, among other things. In some implementations, computing device 102 may include multiple bus interfaces for communicating with multiple external entities. These multiple bus interfaces may implement the same local bus protocol, different local bus protocols, or a combination of the same and different bus protocols.

In some embodiments, I/O device(s) 120 and/or communication connections 118 may comprise a network card or a smart network card. In some embodiments, compression/decompression logic 112 may operate on a network card. For example, compression/decompression logic 112 may be implemented as a processing logic on the network card. In this way, compression/decompression logic 112 may act to compress or decompress a data stream being received by, or transmitted from, computing device 102, which may be done automatically (e.g., without any instruction from computing device 102).

In accordance with at least some embodiments, computing device 102 may be a network interface controller (i.e., a network card). The network interface controller may be configured to process data traveling between a computing device and a network. In some embodiments, all data being provided by the computing device to the network may be compressed automatically using compression/decompression logic 112. In some embodiments, all data being provided by the network to the computing device may be decompressed automatically using compression/decompression logic 112. In some embodiments, the network card may have limited processing power, more stringent power requirements than a general purpose processor, and/or may need to make real time streaming decisions without having the context that a general purpose processor might have. For example, the network card may not know ahead of time whether data received by the network card to be processed is encrypted (and hence may not be compressible).

Figure 2:
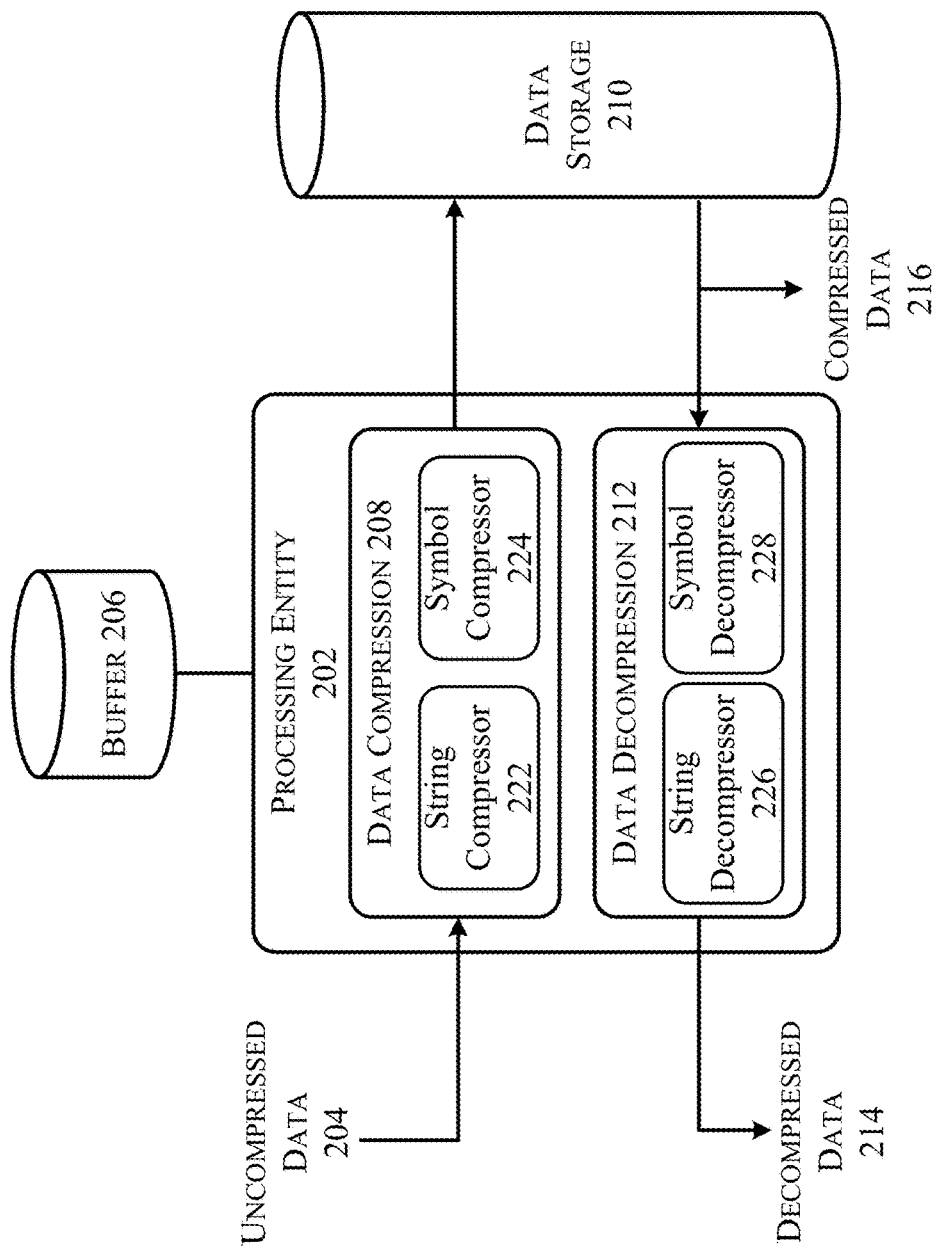
FIG. 2 depicts an example data processing flow that may be implemented in accordance with at least some embodiments.

FIG. 2 depicts an example data processing flow that may be implemented in accordance with at least some embodiments. In FIG. 2, a processing entity 202 may receive an instruction to compress data of an uncompressed data stream 204. Processing entity 202 may comprise an integrated circuit, such as an application-specific integrated circuit (ASIC), a field-programmable gate array (FPGA), a microcontroller, a microprocessor, a graphics processing unit (GPU), or a system on chip (SoC).

Upon receiving instructions to compress data of uncompressed data stream 204, processing entity 202 may load at least a portion of data of uncompressed data stream 204 into buffer 206 to be processed. The size of the portion of data loaded may be determined by a capacity of buffer 206. In accordance with at least some embodiments, buffer 206 may be an example of buffer 114 of FIG. 1. Buffer 206 may be communicatively coupled to processing entity 202 or may be an on-chip memory on processing entity 202.

Upon loading the portion of data into buffer 206, processing entity 202 may perform a data compression function 208 on the loaded portion of data. Once data compression function 208 has been completed, the compressed data may be stored at data storage 210. In some embodiments, data storage 210 may be an example of data storage 116 of FIG. 1.

In accordance with at least some embodiments, data compression function 208 may compress data in buffer 206 by generating sequences from that data. Data compression function 208 may include a string compressor 222 and a symbol compressor 224. String compressor 222 may search for at least one data segment within buffer 206 that exactly matches another data segment within buffer 206 using a data compression technique. The data compression technique may replace repeated occurrences of a data segment in uncompressed data stream 204 with references to a single copy of that data segment existing earlier in uncompressed data stream 204. This may result in the generation of a sequence or a block of compressed data (though it should be noted that the sequence may contain uncompressible data or literals). Some embodiments of the data compression technique may utilize a search pointer or cursor that moves through buffer 206. In order to spot matches, data compression function 208 may keep track of some amount of the most recent data that the search pointer has passed, such as the last 2 kB, 4 kB, or 32 kB. Some embodiments of the data compression technique may utilize a dictionary. For example, data compression function 208 may operate by searching for matches between the data string to be compressed and a set of strings contained in a data structure (i.e., a dictionary) maintained by data compression function 208. It should be noted that any suitable data compression technique may be utilized by string compressor 222. Symbol compressor 224 may further compress the data by reducing the average number of bits used to represent individual symbols. For example, in some implementations, codes may be assigned to symbols in a given block of data based on the probability of the symbol occurring. The probability of a symbol occurring may be inversely proportional to the length of the code for the symbol. As such, the data may be represented in a shorter way.

In accordance with at least some embodiments, data compression function 208 may treat a portion of the data stream stored in buffer 206 as a separate data stream to be compressed. For example, a portion of the data from uncompressed data stream 204 may be loaded into buffer 206. This portion of data may then be compressed by data compression function 208 independent from any other compression performed with respect to the rest of the data in uncompressed data stream 204. Additionally, where no matches may be found in the portion of the data stream loaded into the buffer, data compression function 208 may generate a sequence having no matching or compressed data.

In accordance with at least some embodiments, compressed data 216 stored in data storage 210 may be transmitted to a second computing device. For example, compressed data 216 may be retrieved from data storage 210 and routed over a network connection to a second computing device capable of decompressing compressed data 216. Compressed data 216 may then be stored at the second computing device or decompressed. In this way, an amount of network bandwidth needed to transmit data may be reduced according to at least some implementations of the disclosure.

In accordance with at least some embodiments, processing entity 202 may receive instructions to decompress one or more pieces of data stored in data storage 210. In one example, the processing entity may receive a request for an uncompressed version of a particular piece of data. The processing entity may determine a location at which the data is stored via one or more attributes of data storage 210 (e.g., using an index) and load one or more sequences into buffer 206. A data decompression function 212 may be used to decompress the compressed data. Data decompression function 212 may include a symbol decompressor 228 and a string decompressor 226, which may perform the reverse functions of symbol compressor 224 and string compressor 222, respectively. Decompressed data 214 may be provided to a requesting entity, such as an application or module.

As discussed above, lossless data compression can be used to reduce the size of a file, such that a decompression function can restore the original file with no loss of data. Lossless data compression is used ubiquitously in computing, from saving space on personal computers to sending data over the web, communicating over a secure shell, or viewing a Portable Network Graphics (PNG) or Graphics Interchange Format (GIF) image. Lossless data compression can reduce the size of a file because any non-random file includes duplicated information that can be condensed. For example, statistical modeling techniques can be used to determine the probability that a symbol (e.g., a character) or a string (e.g., a phrase) may appear. These statistical models can then be used to generate codes for specific characters or phrases based on their probability of appearing in the file and assign the shortest codes to the most common characters or phrases. Such techniques may include entropy encoding, run-length encoding, and compression using a dictionary. Using these techniques, a character or a string of characters may be represented by less bits, resulting in a large amount of redundant data being removed.

Examples of entropy encoding include, for example, Shannon-Fano coding or Huffman coding. These methods compress data by reducing the average number of bits used to represent individual symbols. For example, Shannon-Fano coding assigns codes to symbols in a given block of data based on the probability of the symbol occurring. The probability of a symbol occurring is inversely proportional to the length of the code for the symbol, resulting in a shorter way to represent the data. Shannon-Fano coding may not always produce optimal codes due to the way it builds a binary tree from the bottom up. Huffman coding may be used instead as it can generates an optimal code for any given input. The entropy encoding may be used by, for example, symbol compressor 224 of FIG. 2.

Example techniques for data compression using a dictionary include, for example, LZ77 and its variants, and LZ78 and its variants. In dictionary-based data compression, strings of symbols may be added to the library and may be referenced by later occurrences of the strings of symbols. The dictionary may be static, where entries may be predefined according to the application of the text and remain constant. The dictionary may also be adaptive, where entries are taken from the data to be compressed and are created on the fly. For example, LZ77 compression technique uses an adaptive compression dictionary (often referred to as a "sliding window") to compress multiple symbols or strings of symbols, which is generally more efficient than data compressing by reducing the average number of bits used to represent individual symbols (e.g., entropy encoding). The LZ78 compression technique parses input data and generates a dictionary that is stored as a digital tree (often referred to as a "trie"). Most LZ compression methods have some maximum size for the dictionary. When it is full, an entry in the dictionary (e.g., a phrase), such as a least frequently used phrase or an oldest entry in the dictionary, may be dropped and replaced by a new entry (e.g., phrase). This may help to improve the compression ratio for encoding a message with changing characteristics. Deterministic techniques may be used to choose the entry to be replaced such that both the compressor and the decompressor would drop the same entry in the dictionary.

Figure 3:
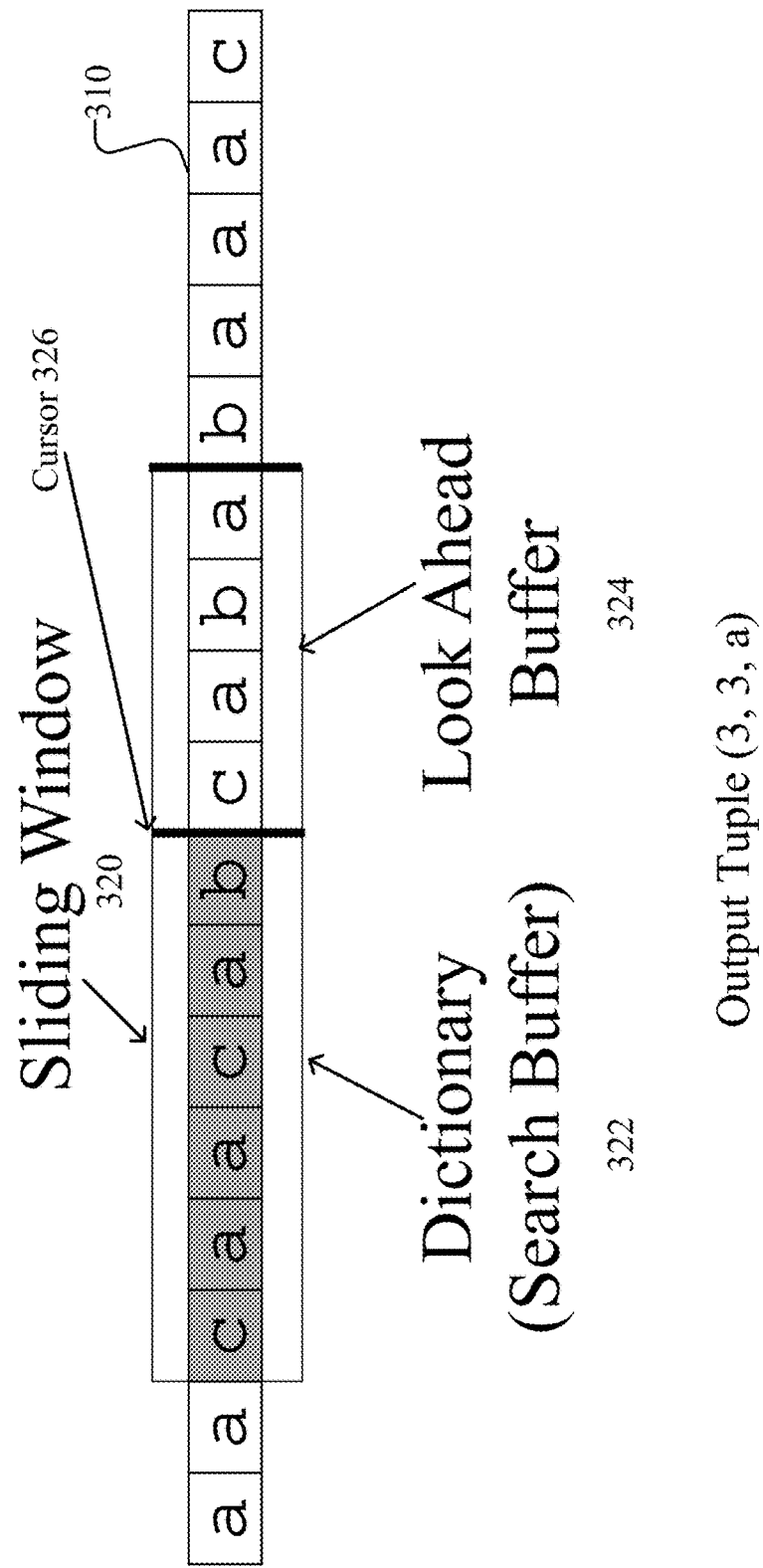
FIG. 3 illustrates an example data compression method using a sliding window.

FIG. 3 illustrates an example data compression method using a sliding window, such as the LZ77 compression method. FIG. 3 shows a data stream 310 including a plurality of symbols being compressed using a sliding window 320. As described above, the LZ77 compression method can achieve data compression by matching later occurred copies of a data string with a single copy of that data string in a dictionary, which may include a sliding window (e.g., sliding window 320) that includes early occurring data strings in an uncompressed data stream. A match can then be encoded by an offset-length pair, rather than the raw data string, to reduce the size of the data.

As shown in FIG. 3, sliding window 320 may include two buffers of predetermined length separated by a cursor 326. One buffer is a dictionary 322 (also referred to as a "search buffer"), which may include d elements (e.g., symbols or characters). The encoder or compressor may keep the search buffer to look for matches, and the decoder or decompressor may keep the search buffer to interpret the matches the encoder references. In various implementations, d may be, for example, 1 k, 4 k, 16 k, 64 k, 256 k, 1 M, 4 M, 16 M, 64 M, or more. The position (which may also be referred to as "offset") of each element in the dictionary may be presented by, for example, 10, 12, 14, 16, 18, 20, 22, 24, 26, or more bits. The larger the search buffer, the further back the encoder may search for matching strings, and the higher the probability that a long match may be found. On the other hand, the larger the search buffer, the longer the search time may be and the higher number of bits may be needed to represent the location of the matching string in the search buffer. Therefore, the search buffer should be large enough for a high probability of matching, but should not be too large so as to require a high number of bits to encode the location (offset) of the matching string. In one example, the searching buffer may include 4096 elements that each can be uniquely identified by a 12-bit number.

The second buffer of sliding window 320 is a look-ahead buffer 324, which may include b elements (e.g., characters or symbols). Look-ahead buffer 324 may include elements to be encoded using elements in dictionary 322 and may represent the maximum match length. The length of look-ahead buffer 324 (i.e., the maximum match length) may be represented by, for example, 4 bits, 5 bits, 6 bits, or more, which may correspond to 16, 32, 64, or more elements. In one example, the length of look-ahead buffer 324 may be 16.

The compressor may search dictionary 322 to find the longest string in dictionary 322 that matches the string in look-ahead buffer 324. For example, in the example shown in FIG. 3, elements 3, 2, and 1 ("cab") matches "cab" in look-ahead buffer 324. A data token (also referred to as a "tuple") may then be created to represent the encoding. In some examples, each tuple may include three fields. The first field may indicate the offset of the beginning of the matching string in the dictionary from a cursor. For example, in the example shown in FIG. 3, the offset of "cab" in dictionary 322 from cursor 326 is 3. The second field in the tuple may indicate the length of the longest match of the string in the dictionary to the string in the look-ahead buffer. For example, in the example shown in FIG. 3, the length of the longest match is 3. The last field in the tuple may indicate the next unmatched element in the look-ahead buffer or, if a match can be found for the whole string in the look-ahead buffer, the next unmatched element in data stream 310. For example, in the example shown in FIG. 3, the next unmatched element is "a." Therefore, string "caba" in look-ahead buffer 324 can be encoded by an output tuple (3, 3, a).

Thus, for a dictionary of 4096 elements (12 bits) and a look-ahead buffer of 16 elements (4 bits for 16 possible codes 0-15, where 0 indicates that there are no matching characters, and the remaining codes 1-15 indicate a match and the corresponding length), a tuple may include 3 bytes, where the first two bytes represent the offset (12 bits) and the longest match (4 bits), and the third byte represents the next unmatched element. As such, if there are less than 3 matching elements (0-2), the same number of bits or more bits may be needed to encode the matching string and the next unmatched element than the number of bits used to represent the uncompressed data, and thus no data compression may be achieved.

After a tuple is generated for at least a portion of look-ahead buffer 324, slide window 320 may be shifted to the right such that cursor 326 is after the next unmatched element. For example, in the example shown in FIG. 3, sliding window 320 will be right-shifted by 4 elements, and cursor 326 will be after the last "a" in the current look-ahead buffer 324.

As mentioned above and described in detail below, one issue with the sliding window-based (or any adaptive dictionary-based) compression technique is that, at the beginning of the data compression, the dictionary is empty and is filled with entries gradually. Thus, the probability to find a match in the dictionary is low at the beginning of the data compression.

Figure 4:
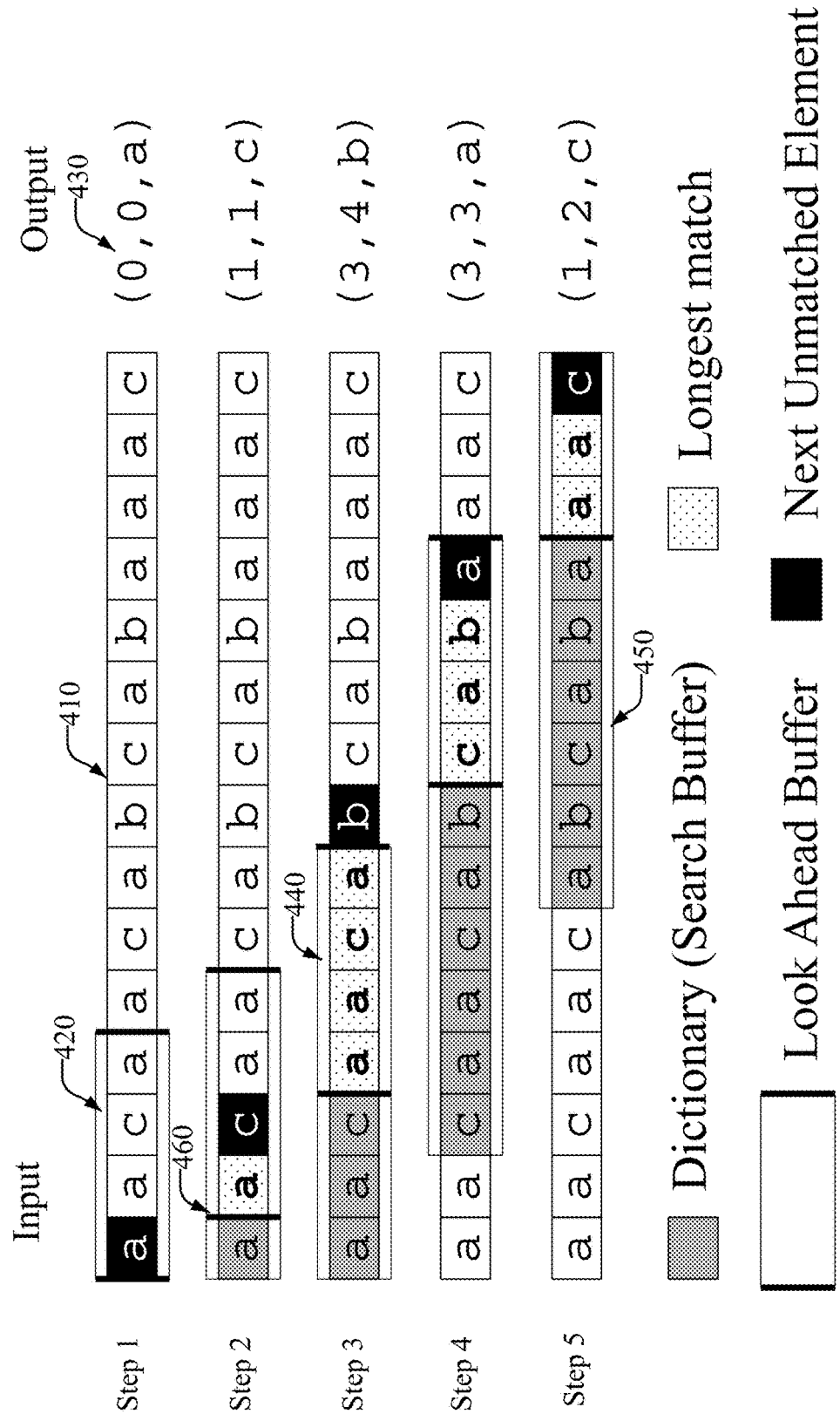
FIG. 4 illustrates an example of data compression using a sliding window-based compression method.

FIG. 4 illustrates an example of data compression using a sliding window-based compression method, such as the LZ77 compression method. To compress (encode) a data stream 410, a sliding window 420 may be used. At the beginning of the data compression, a dictionary 450 of sliding window 420 may be empty. In the first step, a look-ahead buffer 440 of sliding window 420 includes a string "aaca." Because dictionary 450 is empty, no matching string can be found in dictionary 450. Thus, the offset and the length of the longest match are both 0. The next unmatched element is the data stream is "a." As such, the first tuple of output 430 of the data compression is (0, 0, a) to encode "a," and sting "a" can be put in the dictionary.

In the second step, after the first tuple is generated, the sliding window may be shifted (by one element that has been encoded in step 1) such that string "a" is in dictionary 450 and a cursor 460 is after the previous unmatched element "a." The new string in look-ahead buffer 440 is "acaa." The compressor may search dictionary 450 to find the longest match for string "acaa" that is in the look-ahead buffer. In the example shown, the longest match in the dictionary is a single element "a," which is the only element in dictionary 450 and is one element before cursor 460, and the next unmatched element is "c." Thus, the second tuple of output 430 of the data compression is (1, 1, c).

In the third step, after the second tuple is generated, the sliding window may be shifted further (by two elements that have been encoded in step 2) such that string "aac" is in dictionary 450 and current cursor 460 is after the previous unmatched element "c." The new string in look-ahead buffer 440 is "aaca." The compressor may search dictionary 450 to find the longest match for string "aaca" that is in the look-ahead buffer. In the example shown, the longest match in the dictionary is "aac," which is three elements before current cursor 460. In many implementations, it is not only acceptable, but also frequently useful to allow the length of the longest match be greater than the offset. For example, the matching string may be copied more than a single time to match the sting in the look-ahead buffer. Thus, in the example shown in FIG. 4, the matching string in dictionary 450 is "aac," and the longest match in look-ahead buffer 440 is "aaca," which may be replicated by copying "aac" more than one time until the number of copied elements is equal to the longest match (4 here). The next unmatched element in data stream 410 is b. Thus, the third tuple of output 430 of the data compression is (3, 4, b).

In the fourth step, the sliding window may be shifted further (by five elements that have been encoded in step 3) such that cursor 460 is after the previous unmatched element "b." Because the size of dictionary 450 is 6 in the example shown in FIG. 4, when previous encoded string "aacab" is shifted into dictionary 450, string "aa" is shifted out of dictionary 450. The string in dictionary 450 becomes "caacab," and the string in look-ahead buffer 440 becomes "caba." The compressor may search dictionary 450 to find the longest match for string "caba" that is in look-ahead buffer 440. In the example shown, the longest match in the dictionary is "cab," which is three elements before current cursor 460, and the next unmatched element in data stream 410 is "a." Thus, the fourth tuple of output 430 of the data compression is (3, 3, a).

In the fifth step, the sliding window may be shifted further (by four elements that have been encoded in step 4) such that cursor 460 is after the previous unmatched element "a." When previously encoded string "caba" is shifted into dictionary 450, string "caac" is shifted out of dictionary 450. The string in dictionary 450 becomes "abcaba," and the string in look-ahead buffer 440 becomes "aac." The compressor may search dictionary 450 to find the longest match for string "aac" that is in the look-ahead buffer. In the example shown, the matching string in dictionary 450 is "a," and the longest match in look-ahead buffer 440 is "aa," which may be replicated by copying matching string "a" in the dictionary twice. The next unmatched element in data stream 410 is "c." Thus, the fifth tuple of output 430 of the data compression is (1, 2, c). It is noted that, in step 5, two copies of string "aac" has been shifted out of dictionary 450, and thus there is no match between string "aac" in the look-ahead buffer and a string in the dictionary.

As a result, data stream "aacaacabcabaaac" may be encoded as (0, 0, a), (1, 1, c), (3, 4, b), (3, 3, a), and (1, 2, c) in the compressed data stream, which may be sent to a receiver. The receiver, after receiving the compressed data stream, may decompress (or decode) the compressed data stream to replicate the original data stream. As described above, additional data compression using, for example, Huffman coding, may be performed to further compress the data stream by reducing the average number of bits used to represent each symbol (or tuple field).

Figure 5:
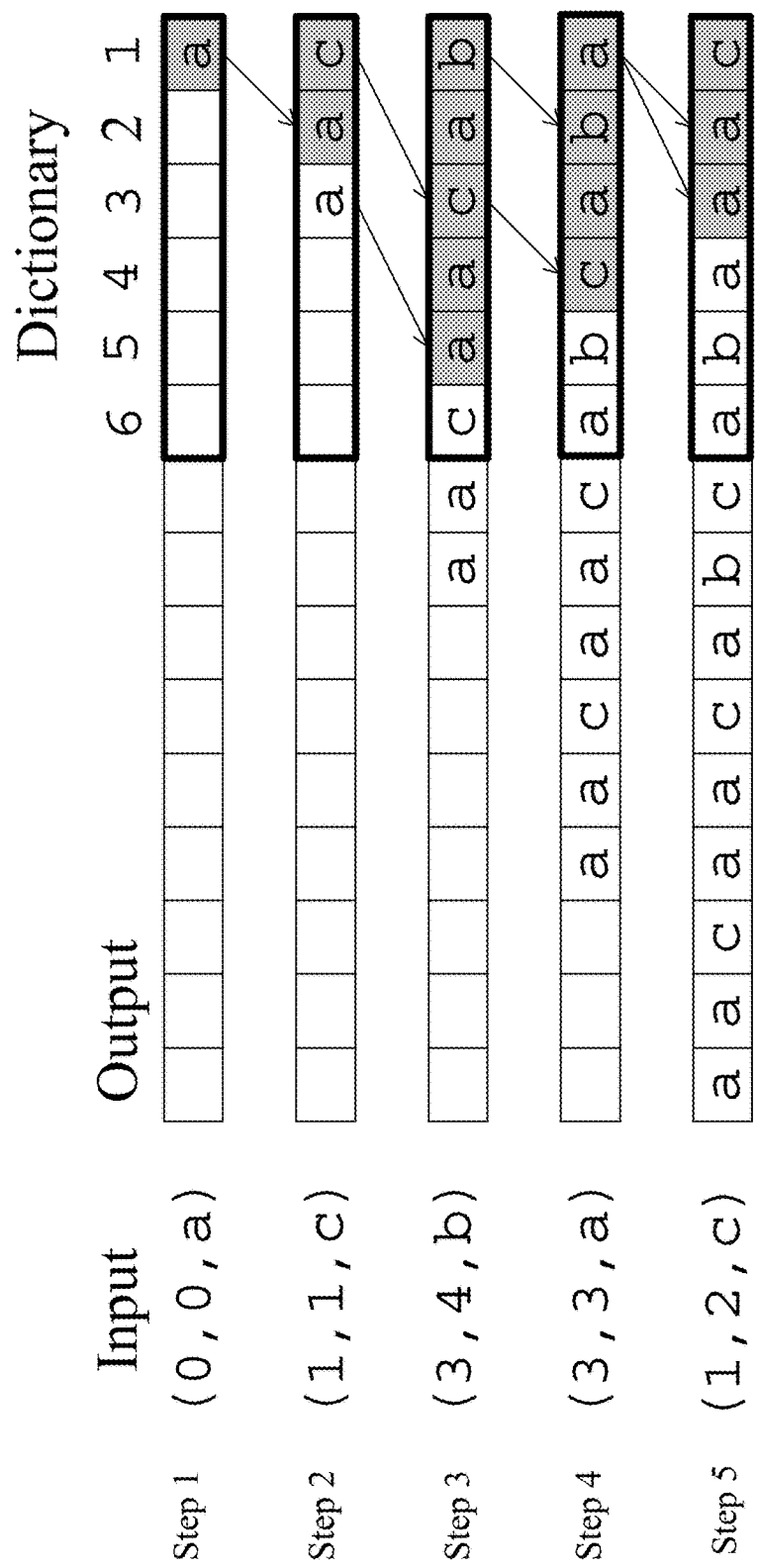
FIG. 5 illustrates an example of data decompression using a sliding window-based compression method.

FIG. 5 illustrates an example of data decompression using a sliding window-based compression method, such as the LZ77 compression method. The compressed data stream includes 5 tuples: (0, 0, a), (1, 1, c), (3, 4, b), (3, 3, a), and (1, 2, c). The decompressor may process one tuple at a time. In the first step, the tuple is (0, 0, a), which indicates that there is no match in the dictionary (which is empty now on the receiver of the compressed data stream) and the next element is "a." Thus, string "a" will be put into the decompressed data stream and the dictionary.

In the second step, the tuple to be decoded is (1, 1, c), which indicates that there is a matching string in the dictionary from element 1 ("a"), the longest match is 1 element, and the next unmatched element is "c." Thus, the decoded string for the second tuple is "ac," which may be added to the decompressed data stream and the dictionary.

In the third step, the tuple to be decoded is (3, 4, b), which indicates that there is a matching string in the dictionary from element 3 ("a"), the longest match is 4 elements from element 3, and the next unmatched element is "b." Thus, the decoded string for the third tuple is "aacab," which may be added to the decompressed data stream and the dictionary. When the new decoded string "aacab" is added to the dictionary, string "aa" may be pushed out of the dictionary and the string in the dictionary becomes "caacab."

In the fourth step, the tuple to be decoded is (3, 3, a), which indicates that there is a matching string in the dictionary from element 3 ("c"), the longest match is 3 elements, and the next unmatched element is "a." Thus, the decoded string for the fourth tuple is "caba," which may be added to the decompressed data stream and the dictionary. While 4 new elements "caba" are added to the dictionary, 4 elements "caac" are pushed out of the dictionary. The new string in the dictionary becomes "abcaba."

In the fifth step, the tuple to be decoded is (1, 2, c), which indicates that there is a matching string in the dictionary from element 1 ("a"), the longest match is 2 elements, and the next unmatched element is "c." Thus, the decoded string for the fifth tuple is "aac," which may be added to the decompressed data stream and the dictionary. As a result, the receiver of the compressed data stream may decompress the compressed data stream without prior knowledge of the dictionary used to generate the compressed data stream.

There are many variations of the LZ77 compression technique, including, for example, Lempel-Ziv-Storer-Szymanski (LZSS), Lempel-Ziv-Bell (LZB), Lempel-Ziv-Huffman (LZH), Lempel-Ziv-Rodeh (LZR), Lempel-Ziv-Fiala-Greene (LZFG), Lempel-Ziv-Markov (LZMA), Deflate, etc. For example, the LZSS method improves on LZ77 in that it can detect whether the encoding will decrease the data size or not. If no data size reduction will be achieved, the section of the input data stream may be left unchanged in the output. Otherwise, the section of the input data stream may be replaced with an offset-length pair (or length-offset pair) as described above. More specifically, the LZSS method improves over the LZ77 method by using a 1 bit flag to indicate whether the next section of data stream is a literal or an offset-length pair, and using literals if the offset-length pairs would be longer. Another improvement of LZSS over LZ77 comes from the elimination of the next unmatched element and just using the offset-length pair. LZSS is used in many popular archive formats, including RAR. It is also sometimes used for network data compression.

As described above, there are other compression techniques that use a dictionary built on-the-fly other than a sliding window. For example, in the LZ78 method, rather than using a sliding window as the dictionary, a dictionary in the form of a digital tree (also referred to as a trie) may be generated as the input data stream is parsed. While parsing the input data stream, the LZ78 method may add each newly encountered symbol or string of symbols to the dictionary. For each new symbol or string in the input data stream, a dictionary entry in the form of (dictionary index, string) may be generated. For example, if a current symbol or string being compressed is already in the dictionary, the dictionary index of the longest matching string in the dictionary may be used to represent the current symbol or string, and a new dictionary entry including a string that includes the longest matching string and the next unmatched symbol may be added to the dictionary. If the current symbol or string being compressed is not in the dictionary, a new single symbol entry may be added to the dictionary. The entries may form a linked-list (or tree) type data structure. In some embodiments, the size of the dictionary may be limited to, for example, a few megabytes, to reduce memory requirements. Once the dictionary is full, no more entries may be added or, in some variants of LZ78, older entries may be replaced with newer entries.

In LZ78, the output of the data compression may be a tuple in the form of (dictionary index, next unmatched symbol), where the dictionary index indicates the index of the entry in the dictionary that matches the longest part of the current string being compressed, and the next unmatched symbol indicates the next symbol of the current string being compressed after the longest matching entry in the dictionary.

Figure 6:
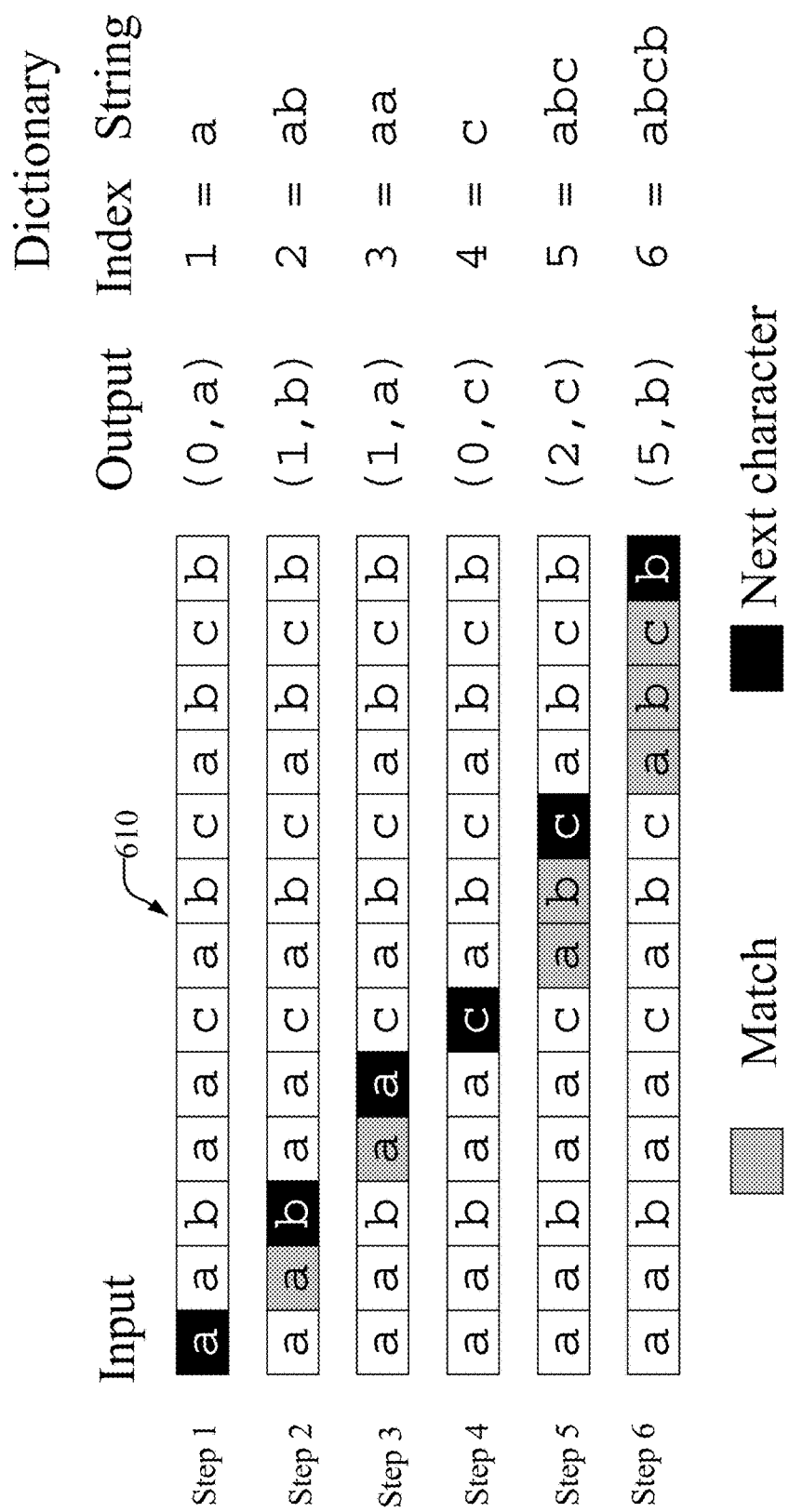
FIG. 6 illustrates an example of data compression using a dictionary-based compression method.

FIG. 6 illustrates an example of data compression using a dictionary-based compression method, such as the LZ78 compression method. As shown in FIG. 6, for an input data stream 610, the first symbol "a" may be parsed in the first step. Since there is no entry in the dictionary, a new entry with a dictionary index of 1 and a string of "a" may be added to the dictionary, and the output of the data compression for the first symbol "a" is (0, a), where 0 indicates that there is no matching string in the dictionary and the string represented by the output is a single symbol, and "a" is the next unmatched symbol in the data stream.

In step 2, the only entry in the dictionary is entry 1 ("a"). The longest matching string in the next portion of input data stream 610 is a single symbol "a" as no entry representing string "ab" can be found in the dictionary. Thus, a new entry 2 representing string "ab" may be added to the dictionary. An output of the compressed data in step 2 is (1, b), where "1" represents the index of the matching dictionary entry, and "b" is the next unmatched symbol.

In step 3, the entries in the dictionary include entry 1 ("a") and entry 2 ("ab"). The longest matching string in the next portion of input data stream 610 is a single symbol "a" as no entry representing string "aa" can be found in the dictionary. Thus, a new entry 3 representing string "aa" may be added to the dictionary. An output of the compressed data in step 3 is (1, a), where "1" represents the index of the matching dictionary entry, and "a" is the next unmatched symbol.

In step 4, the next symbol in input data stream 610 is a symbol "c." No matching entry representing string "c" can be found in the dictionary. Thus, a new entry 4 representing string "c" may be added to the dictionary. An output of the compressed data in step 4 is (0, c), where "0" indicates that there is no matching string in the dictionary and the string represented by the output is a single symbol, and "c" is the next unmatched symbol.

In step 5, the longest matching string in the next portion of input data stream 610 is "ab," which matches entry 2 in the dictionary, because no entry representing string "abc" can be found in the dictionary. Thus, a new entry 5 representing string "abc" may be added to the dictionary. An output of the compressed data in step 5 is (2, c), where "2" represents the index of the matching dictionary entry, and "c" is the next unmatched symbol.

In step 6, the longest matching string in the next portion of input data stream 610 is "abc," which matches entry 5 in the dictionary, because no entry representing string "abcb" can be found in the dictionary. Thus, a new entry 6 representing string "abcb" may be added to the dictionary. An output of the compressed data in step 6 is (5, b), where "5" represents the index of the matching dictionary entry, and "b" is the next unmatched symbol.

Thus, input data stream "aabaacabcabcb" may be encoded as tuples (0, a), (1, b), (1, a), (0, c), (2, c), and (5, b), which may be sent to a receiver. The receiver, after receiving the compressed data stream, may decompress (or decode) the compressed data stream to replicate the original data stream. As described above, additional compression using, for example, Huffman coding, may be performed to further compress the data stream by reducing the average number of bits used to represent each symbol or dictionary index.

FIG. 7 illustrates an example of data decompression using a dictionary-based compression method, such as the LZ78 decompression method. The compressed data stream includes 6 tuples: (0, a), (1, b), (1, a), (0, c), (2, c), and (5, b). The decompressor may process one tuple at a time. In the first step, the tuple to be decoded is (0, a), which indicates that there is no match in the dictionary (which is empty now on the receiver of the compressed data stream) and the next element is "a." Thus, "a" will be put into the decompressed data stream and entry 1 of the dictionary. In step 2, the tuple to be decoded is (1, b), which indicates that the string encoded by the tuple includes entry 1 of the dictionary and an additional symbol "b." Thus, a string "ab" may be put into the decompressed data stream and entry 2 of the dictionary. In step 3, the tuple to be decoded is (1, a), which indicates that the string encoded by the tuple includes entry 1 of the dictionary and an additional symbol "a." Thus, a string "aa" may be put into the decompressed data stream and entry 3 of the dictionary. In step 4, the tuple to be decoded is (0, c), which indicates that there is no match in the dictionary and the next element is "c." Thus, a string "c" may be put into the decompressed data stream and entry 4 of the dictionary. In step 5, the tuple to be decoded is (2, c), which indicates that the string encoded by the tuple includes entry 2 ("ab") of the dictionary and an additional symbol "c." Thus, a string "abc" may be put into the decompressed data stream and entry 5 of the dictionary. In step 6, the tuple to be decoded is (5, b), which indicates that the string encoded by the tuple includes entry 5 ("abc") of the dictionary and an additional symbol "b." Thus, a string "abcb" may be put into the decompressed data stream and entry 6 of the dictionary. As a result, the receiver of the compressed data stream may decompress the compressed data stream without prior knowledge of the dictionary used to generate the compressed data stream.

As LZ77 and its variants, LZ78 and its variants, such as Lempel-Ziv-Welch (LZW) and Lempel-Ziv Compress (LZC), may have a high compression ratio for large files. However, for smaller files, the methods essentially just create and store the dictionary. This may result in little to no gain in data size reduction.

Techniques disclosed herein may improve the compression ratio for any dictionary-based techniques, such as LZ77, LZ78, and their variants as described above, by using a pre-generated dictionary that includes entries (data sequences) that are most likely to be found in the beginning of a file or other data block to be compressed, regardless of the size of the data block to be compressed. When a compression process begins, an appropriate compression dictionary that is generated in advance manually or using a tool, may be loaded into a buffer and used to compress the file or other data block. Because a high (if not maximum) compression ratio may be achieved using the loaded dictionary from the beginning of the compression process, a high overall compression ratio may be achieved regardless of the size of the file or other data block.

Figure 8:
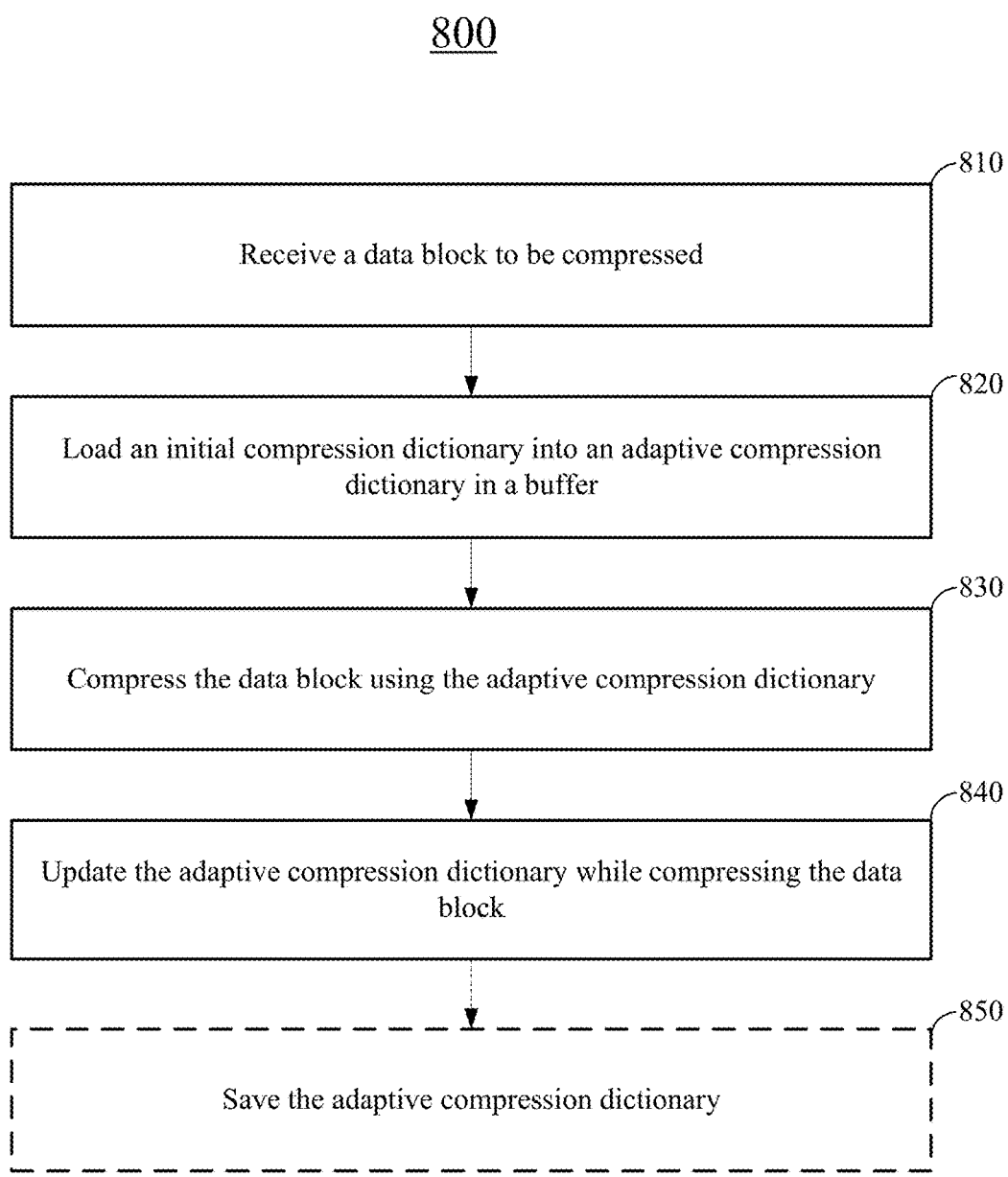
FIG. 8 illustrates an example method of compressing data using a pre-existing initial compression dictionary, according to certain embodiments.

FIG. 8 illustrates an example method 800 of compressing data using a pre-existing initial compression dictionary, according to certain embodiments. Method 800 may be performed by the systems described above, such as, for example, compression/decompression logic 112 of FIG. 1 or processing entity 202 of FIG. 2.

At block 810, a compression logic may receive a data block to be compressed. The data block to be compressed may include, for example, a file (e.g., an image file), an Internet Protocol (IP) packet or other network transport unit, a data stream, etc.

At block 820, the compression logic may load a pre-existing initial compression dictionary into an adaptive compression dictionary in a buffer (e.g., buffer 114 or 206) for data compression. The pre-existing initial compression dictionary may be generated manually or using an automatic tool, by a user or by an application program. One possible way of generating the pre-existing initial compression dictionary is described below. The pre-existing initial compression dictionary may be stored at a remote location, such as a centralized database on a remote server. The pre-existing initial compression dictionary may also be stored locally, for example, for data that may include confidential information. In various implementations, different dictionaries may be generated in advance for different types of applications, such as HTTP, SSL, SSD, etc. Thus, the compression logic may select an appropriate pre-existing initial compression dictionary based on the application or the type of data (e.g., image file or IP packets) to be compressed. In some implementations, a tool may be used to analyze the first N bytes of data similar to the data to be compressed to generate the dictionary, as described in detail below with respect to FIG. 9. The size of the dictionary may be determined based on the standard used, such as 32 kilobyte (KB) or 64 KB in some standards (e.g., Deflate method used in gzip, portable network graphics (PNG), HTTP, SSL, etc.), or based on the hardware (e.g., memory or buffer) capacity, or may be determined to optimize the compression speed and compression ratio as described above. The adaptive compression dictionary may be in the form of a sliding window or may be a dictionary stored in a data structure, such as a list, a tree, or a table.

At block 830, the compression logic may compress the data block using the adaptive compression dictionary loaded in the buffer. For example, the compression logic may use a sliding window-based compression method, such as LZ77 or its variants, as described above with respect to FIGS. 3 and 4. In some implementations, the compression logic may use a tree-structured dictionary-based compression method, such as LZ78 or its variants, as described above with respect to FIG. 6.

At block 840, as described above with respect to FIGS. 4 and 6, the compression logic may update the adaptive compression dictionary while compressing the data block. For example, when a sliding window is used, newer strings may be added to the dictionary (i.e., search buffer), while older strings may be pushed out of the search buffer. As such, previously used strings may be pushed out of the search buffer. When a tree-structured dictionary is used, various methods may be used, for example, to replace the least frequently used entries (e.g., strings) with new entries, or to replace the oldest entries with new strings. In some implementations, a deterministic method may be used to replace the entries in the dictionary with new entries such that both the compression logic and a decompression logic on a receiver of the compressed data can update the adaptive compression dictionary in a same manner.

Optionally, at block 850, the adaptive compression dictionary may be saved periodically or after the data compression is completed. In some embodiments, the saved compression dictionary may be used as the pre-existing initial compression dictionary to compress similar files or data for similar applications. For example, when the dictionary is updated by replacing least frequently used strings with new strings, the resultant compression dictionary may include the most frequently used strings for similar files or data for similar applications.

It is noted that even though FIG. 8 describes an example method of compressing data using a pre-existing initial compression dictionary, similar methods may be used to decompress a compressed data block. For example, when a data block to be decompressed is received, an initial compression dictionary may be selected and loaded into an adaptive compression dictionary in a buffer. The compressed data block may then be decompressed using the adaptive compression dictionary as described above, for example, with respect to FIGS. 5 and 7. The decompressed data may be used to update the adaptive compression dictionary.

As described above, there may be many ways to generate the initial compression dictionary. For example, in some cases, a user may provide the initial compression dictionary based on the known common sequences, such as sequence of zeros, sequence of ones, common sequences in a file header for a type of file (e.g., image file or packet) etc. In one example, the initial compression dictionary may include, for example, a string including 128 or 256 0s, and/or a string including 128 or 256 1s, such that any string with less than 128 or 256 consecutive 0s or 1s will have a matching string in the initial compression dictionary. Such a compression dictionary may be used to compress, for example, image files that may include areas having only black or only white pixels.

In some implementations, a software tool, such as an application program, may be used to scan application data (e.g., HTTP packets, SSD blocks, image files, etc.) and determine the appropriate initial compression dictionary to use for each type of application. The initial compression dictionary may be accessible to both the compressor and decompressor for compressing and decompressing using the same initial compression dictionary. For example, the initial compression dictionaries for different types of applications may be stored in a centralized server or database that can be accessed by the compressor and decompressor.

Figure 9:
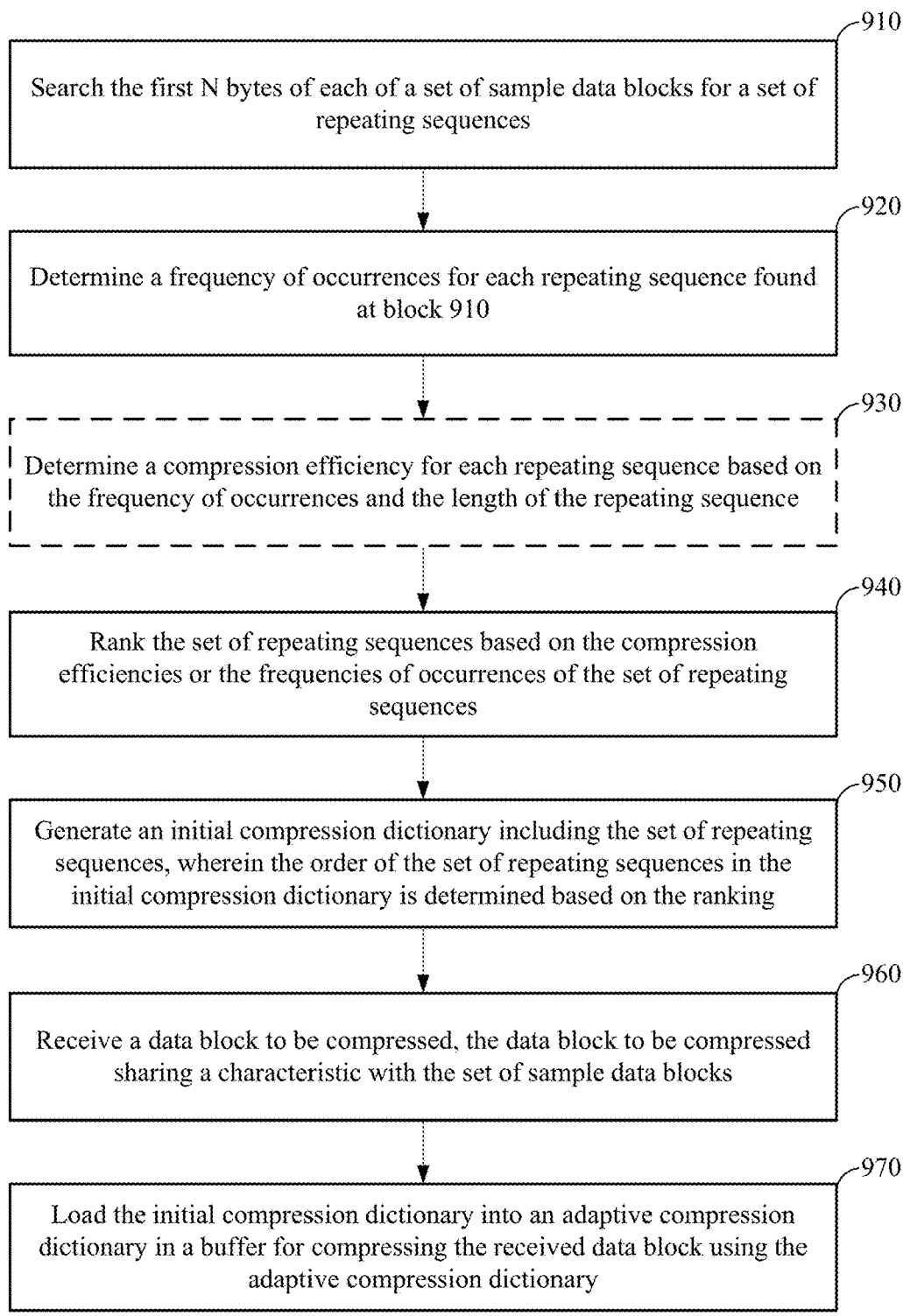
FIG. 9 illustrates an example method for generating an initial compression dictionary, according to certain embodiments.

FIG. 9 illustrates an example method 900 for generating an initial compression dictionary, according to certain embodiments. The initial compression dictionary may be generated by performing a statistical analysis of the first N bytes of data of one or more sample file or other sample data blocks (e.g., data streams) to find repeating sequences, and using the repeating sequences that may be most effective for improving the compression ratio as entries in the dictionary. The method may be implemented as an application program, using a hardware circuit, or using a combination of hardware and software.

At block 910, an automatic tool may scan and parse the first N bytes of data of each of a set of sample data blocks to find repeating sequences. The set of sample data blocks may share a common characteristic, such as a same type of file (e.g., .docx or .jpg file) or a same protocol used for the set of sample data blocks (e.g., network packets). N may be a number, such as 4 k, 16 k, ..., 4 M, 16 M, or more. Various methods known in the art may be used to find repeating sequences in the first N bytes of data, such as, for example, Naive pattern searching, Rabin-Karp and Knuth-Morris-Pratt methods, or Boyer-Moore string search method.

At block 920, based on the repeating sequences found at block 910, the frequency of occurrences for each repeating sequence may be determined. Optionally, at block 930, a compression efficiency may be determined for each repeating sequence based on the frequency of occurrences and the length of the repeating sequence. In one implementation, the compression efficiency of a repeating sequence may be the product of the length of the repeating sequence and the frequency that the repeating sequence appears in the first N bytes of data of each of the set of sample data blocks. For example, if a first repeating sequence is 20 bytes long, and appears in 10% of the first N bytes of data of each of the set of sample data blocks, the compression efficiency of the first repeating sequence can be calculated as 20 B×10%=2 B. If a second repeating sequence is 10 bytes long, and appears in 30% of the first N bytes of data of each of the set of sample data blocks, the compression efficiency of the second repeating sequence can be calculated as 10 B×30%=3 B. Thus, the overall compression ratio using the second repeating sequence may be higher than the overall compression ratio using the first repeating sequence.

At block 940, the repeating sequences found at block 910 may be ranked based on the compression efficiencies determined at block 930 or the frequencies of occurrences determined at block 920. A repeating sequence with a higher compression efficiency or a higher frequency of occurrences may be ranked higher. For example, the second repeating sequence in the example above may be ranked higher than the first repeating sequence.

At block 950, the initial compression dictionary may be generated. The initial compression dictionary may include the repeating sequences found at block 910, where the order of the repeating sequences in the initial compression dictionary may be determined based on the ranking at block 940. A repeating sequence that has a higher ranking may be saved in a location in the initial compression dictionary such that the repeating sequence may stay in an adaptive compression dictionary longer when the initial compression dictionary is loaded into the adaptive compression dictionary that is being updated during data compression. For example, if a sliding window is used, the repeating sequence with a higher ranking may be located near an end of the initial compression dictionary, such that the repeating sequence with a higher ranking is located near an end of the sliding window when the initial compression dictionary is loaded into the sliding window.

At block 960, a data block to be compressed may be received by a processor. Based on the characteristics of the received data block to be compressed, an initial compression dictionary generated using a set of sample data blocks that share one or more characteristics with the received data block to be compressed may be selected. As described above, the characteristics of the data block to be compressed may include the file type of the received data block, a network protocol associated with the received data block, a column in a database associated with the received data block, etc.

At block 970, the initial compression dictionary may be loaded into an adaptive compression dictionary in a buffer, and the received data may be compressed using the adaptive compression dictionary, where the adaptive compression dictionary may be updated dynamically during the data compression as described above. As also described above, the same initial compression dictionary may be used for both data compression and data decompression.

Techniques disclosed herein may be used to compress and/or decompress a single file, packet, data stream, or other data block. The techniques may also be used by a single compressor or decompressor to alternately compress or decompress two or more files, packets, data streams, or other data blocks by loading, updating, saving, and reloading different adaptive compression dictionaries at different times. For example, if a decompressor receives a series of IP packets from each of two sources A and B at about the same time, the decompressor may first load an initial compression dictionary for packets from source A into an adaptive compression dictionary in the buffer, and decompress packets 1 to K from source A using the adaptive compression dictionary while updating the adaptive compression dictionary. The decompressor may save the adaptive compression dictionary into a first temporary compression dictionary after decompressing packet K from source A. The decompressor may then load an initial compression dictionary for packets from source B into an adaptive compression dictionary in the buffer, and decompress packets 1 to L from source B using the adaptive compression dictionary while updating the adaptive compression dictionary. The decompressor may save the adaptive compression dictionary into a second temporary compression dictionary after decompressing packet L from source B. After receiving packet K+1 from source A, the decompressor may load the first temporary compression dictionary into an adaptive compression dictionary in the buffer, and decompress packet K+1 from source A using the adaptive compression dictionary while updating the adaptive compression dictionary. Thus, the packets from each source are effectively decompressed as a single continuous data stream.

Figure 10:
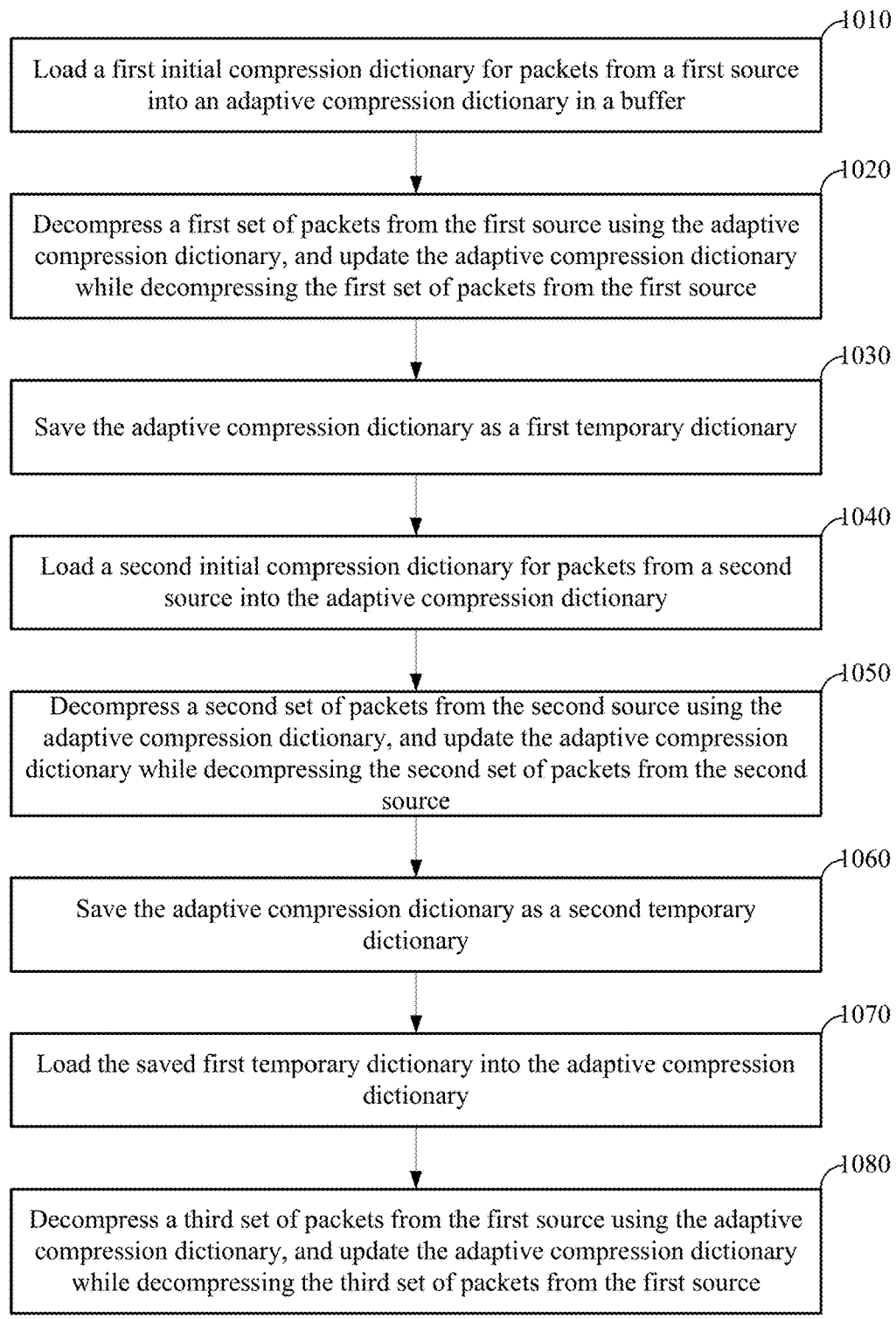
FIG. 10 illustrates an example method for decompressing data for different applications in parallel, according to certain embodiments.

FIG. 10 illustrates an example method 1000 for compressing/decompressing data for different applications in parallel, according to certain embodiments. The method may be performed by the systems described above, such as, for example, compression/decompression logic 112 of FIG. 1 or processing entity 202 of FIG. 2.

At block 1010, a decompressor may load a first initial compression dictionary for packets from a first source after receiving packets from the first source. The first initial compression dictionary may be generated in advance manually or using a tool as described above. The first initial compression dictionary may be located locally or at a centralized location, such as a database or server. The first initial compression dictionary may be selected from a set of initial compression dictionaries based on, for example, the type of packets or the protocol used for the packets to be decompressed. The first initial compression dictionary may be loaded into an adaptive compression dictionary in a buffer of the decompressor or a buffer coupled to the decompressor.

At block 1020, the decompressor may decompress a first set of packets from the first source using the adaptive compression dictionary, and update the adaptive compression dictionary while decompressing the first set of packets from the first source, as described above with respect to FIGS. 4-7.

At block 1030, after the decompressor has decompressed the first set of packets from the first source, the decompressor may save the adaptive compression dictionary into a first temporary dictionary, which may be a file or a data structure, such as, a list, a tree structure, or a table.

At block 1040, the decompressor may load a second initial compression dictionary for packets from a second source. As the first initial compression dictionary, the second initial compression dictionary may be generated in advance manually or using a tool as described above. The second initial compression dictionary may be located locally or at a centralized location, such as a database or server. The second initial compression dictionary may be selected from a set of initial compression dictionaries based on, for example, the type of packets or the protocol used for the packets to be decompressed. The second initial compression dictionary may be loaded into an adaptive compression dictionary in a buffer of the decompressor or a buffer coupled to the decompressor.

At block 1050, the decompressor may decompress a second set of packets from the second source using the adaptive compression dictionary, and update the adaptive compression dictionary while decompressing the second set of packets from the second source, as described above with respect to FIGS. 4-7.

At block 1060, after the decompressor has decompressed the second set of packets from the second source, the decompressor may save the adaptive compression dictionary into a second temporary dictionary, which may be a file or a data structure, such as a list, a tree structure, or a table.

At block 1070, after receiving a third set of packets from the first source, the decompressor may load the saved first temporary dictionary back into an adaptive compression dictionary in the buffer.

At block 1080, the decompressor may decompress the third set of packets from the first source using the reloaded adaptive compression dictionary, and update the adaptive compression dictionary while decompressing the third set of packets from the first source. After the decompressor has decompressed the third set of packets from the first source, the decompressor may save the adaptive compression dictionary to the first temporary dictionary, and reload the second temporary dictionary into an adaptive compression dictionary for processing new packets from the second source. The above operations may be performed repetitively until all packets received from the first source and the second source are decompressed. In some embodiments, the initial compression dictionaries for packets from the first source and the second source, and the first and second temporary dictionaries may be loaded into a same space on the buffer.

Using the above described method, the compression ratio for each individual packet and all packets may be improved. In addition, the compression speed can be improved because there is no need to wait for all packets from a source to arrive and then concatenate the packets from the source before starting to decompress the concatenated packets. Thus, in some cases, the compression or decompression can be performed in nearly real-time and in parallel for multiple data streams.

Even though the example method described above with respect to FIG. 10 is used to decompress received data packets, similar method may be used to compress outgoing data packets from different sources or data packets to different destinations. Furthermore, similar techniques may be used to compress or decompress multiple files or other data blocks (other than IP packets) alternately.

Even though FIGS. 8-10 describe example methods as sequential operations, some of the operations may be performed in parallel or concurrently. An operation may have additional steps not included in the figure. Some operations may be optional, and thus may be omitted in various embodiments. Some operations may be performed together with another operation. Furthermore, embodiments of the methods may be implemented in hardware, software, firmware, middleware, microcode, hardware description languages, or any combination thereof.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computer-implemented method for compressing or decompressing data using an adaptive compression dictionary, the method comprising:
   receiving, by one or more processors, a data block to be compressed;
   selecting, by the one or more processors and based on a characteristic of the data block, an initial compression dictionary from a plurality of initial compression dictionaries, wherein the plurality of initial compression dictionaries are generated manually or by a software tool, based on sample data and prior to receiving the data block to be compressed;
   loading, by the one or more processors, the selected initial compression dictionary into the adaptive compression dictionary in a buffer, wherein the adaptive compression dictionary is fully filled with the selected initial compression dictionary;
   compressing, by the one or more processors, the data block using the fully-filled adaptive compression dictionary by replacing a data sequence in the data block with a tuple indicating a location and a length of a sequence in the adaptive compression dictionary that matches the data sequence in the data block;
   updating the adaptive compression dictionary using data in the data block that has been compressed, while compressing the data block; and
   compressing a remaining portion of the data block using the updated adaptive compression dictionary.

2. The computer-implemented method of claim 1, wherein compressing the data block using the adaptive compression dictionary comprises:
   compressing the data block using the adaptive compression dictionary based on an LZ77-based compression technique or an LZ78-based compression technique.

3. The computer-implemented method of claim 1, wherein the initial compression dictionary is a user-generated dictionary including a set of common sequences.

4. The computer-implemented method of claim 1, further comprising:
   searching a first N bytes of a sample data block to identify a set of repeating sequences, the sample data block sharing the characteristic with the data block to be compressed;
   determining a frequency of occurrences of each of the set of repeating sequences in the first N bytes of the sample data block;
   determining, for each repeating sequence of the set of repeating sequences, a compression efficiency for the repeating sequence based on a length of the repeating sequence and the frequency of occurrences of the repeating sequence in the first N bytes of the sample data block;
   ranking the set of repeating sequences based on the compression efficiency for each repeating sequence of the set of repeating sequences; and
   generating the initial compression dictionary using the set of repeating sequences, where a location of each repeating sequence of the set of repeating sequences in the initial compression dictionary is based on the ranking.

5. A computer-implemented method, comprising:
   receiving a data block to be compressed;
   selecting an initial compression dictionary from a plurality of initial compression dictionaries based on a characteristic of the data block;
   loading the initial compression dictionary into an adaptive compression dictionary in a buffer, wherein the adaptive compression dictionary is fully filled with the selected initial compression dictionary;
   compressing the data block using the fully-filled adaptive compression dictionary; and
   updating the adaptive compression dictionary using data in the data block that has been compressed, while compressing the data block.

6. The computer-implemented method of claim 5, wherein the data block to be compressed comprises a file, a storage block, a network packet, or a data stream.

7. The computer-implemented method of claim 5, wherein the plurality of initial compression dictionaries is generated manually or by a software tool and is stored in a remote or local storage, prior to receiving the data block to be compressed.

8. The computer-implemented method of claim 5, wherein the characteristic of the data block comprises a type of file of the data block, a protocol used for the data block, a column in a database, or a type of data stream of the data block.

9. The computer-implemented method of claim 5, wherein the adaptive compression dictionary comprises a sliding window-based dictionary or a tree-structured dictionary.

10. The computer-implemented method of claim 5, further comprising:
    searching a first N bytes of each sample data block of a set of sample data blocks to identify a set of repeating sequences, wherein the set of sample data blocks shares a characteristic with the data block to be compressed; and
    generating the initial compression dictionary, wherein the initial compression dictionary includes the set of repeating sequences.

11. The computer-implemented method of claim 10, wherein generating the initial compression dictionary comprises:
    determining a frequency of occurrences of each repeating sequence of the set of repeating sequences in the first N bytes of each sample data block of the set of sample data blocks;
    ranking the set of repeating sequences based on the frequency of occurrences; and
    generating the initial compression dictionary using the set of repeating sequences, wherein a location of each repeating sequence of the set of repeating sequences in the initial compression dictionary is based on the ranking.

12. The computer-implemented method of claim 11, wherein ranking the set of repeating sequences comprises:
    determining, for each repeating sequence of the set of repeating sequences, a compression efficiency for the repeating sequence based on a length of the repeating sequence and the frequency of occurrences of the repeating sequence in the first N bytes of each sample data block of the set of sample data blocks; and
    ranking the set of repeating sequences based on the compression efficiency for each repeating sequence of the set of repeating sequences.

13. The computer-implemented method of claim 5, wherein the initial compression dictionary comprises a user-generated set of common sequences.

14. The computer-implemented method of claim 5, wherein compressing the data block using the adaptive compression dictionary comprises:
    replacing a data sequence in the data block with a tuple indicating a location and a length of a sequence in the adaptive compression dictionary that matches the data sequence in the data block.

15. The computer-implemented method of claim 5, wherein updating the adaptive compression dictionary using data in the data block that has been compressed comprises:
   shifting out a data sequence at a beginning of the adaptive compression dictionary and shifting a new data sequence from the data block into an end of the adaptive compression dictionary; or
   replacing a least frequently used data sequence in the adaptive compression dictionary with a new data sequence.

16. The computer-implemented method of claim 5, further comprising:
   saving the adaptive compression dictionary as a first temporary dictionary;
   loading a second initial compression dictionary into a second adaptive compression dictionary;
   compressing a second data block using the second adaptive compression dictionary;
   updating the second adaptive compression dictionary while compressing the second data block;
   saving the second adaptive compression dictionary as a second temporary dictionary;
   loading the first temporary dictionary into a third adaptive compression dictionary; and
   compressing a third data block using the third adaptive compression dictionary.

17. A system comprising:
   a processor; and
   a computer-readable storage medium storing instructions thereon, the instructions, when executed by the processor, causing the processor to:
      receive a data block to be compressed;
      select an initial compression dictionary from a plurality of initial compression dictionaries based on a characteristic of the data block;
      load the initial compression dictionary into an adaptive compression dictionary in a buffer, wherein the adaptive compression dictionary is fully filled with the selected initial compression dictionary;
      compress the data block using the fully-filled adaptive compression dictionary; and
      update the adaptive compression dictionary using data in the data block that has been compressed, while compressing the data block.

18. The system of claim 17, wherein the initial compression dictionary comprises a user-generated set of common sequences.

19. The system of claim 17, wherein the instructions, when executed by the processor, further cause the processor to:
   search a first N bytes of a sample data block to identify a set of repeating sequences, the sample data block sharing a characteristic with the data block to be compressed;
   determine a frequency of occurrences of each of the set of repeating sequences in the first N bytes of the data sample block;
   rank the set of repeating sequences based on the frequency of occurrences; and
   generate the initial compression dictionary using the set of repeating sequences, wherein a location of each of the set of repeating sequences in the initial compression dictionary is based on the ranking.

20. The system of claim 19, wherein ranking the set of repeating sequences comprises:
   determining, for each repeating sequence of the set of repeating sequences, a compression efficiency for the repeating sequence based on a length of the repeating sequence and the frequency of occurrences of the repeating sequence in the first N bytes of the sample data block; and
   ranking the set of repeating sequences based on the compression efficiency for each repeating sequence of the set of repeating sequences.

* * * * *